US006874668B2

(12) United States Patent
Cumings et al.

(10) Patent No.: US 6,874,668 B2
(45) Date of Patent: Apr. 5, 2005

(54) TELESCOPED MULTIWALL NANOTUBE AND MANUFACTURE THEREOF

(75) Inventors: John P. Cumings, Oakland, CA (US);
Alex K. Zettl, Kensington, CA (US);
Steven G. Louie, Berkeley, CA (US);
Marvin L. Cohen, Piedmont, CA (US)

(73) Assignee: The Regents of the University of California, Oakland, CA (US)

( * ) Notice: Subject to any disclaimer, the term of this patent is extended or adjusted under 35 U.S.C. 154(b) by 286 days.

(21) Appl. No.: 09/915,196

(22) Filed: Jul. 24, 2001

(65) Prior Publication Data

US 2002/0070426 A1 Jun. 13, 2002

Related U.S. Application Data

(60) Provisional application No. 60/220,550, filed on Jul. 25, 2000.

(51) Int. Cl.[7] .............................................. B65H 35/02
(52) U.S. Cl. .............................. 225/3; 225/15; 225/16; 445/5; 977/DIG. 1
(58) Field of Search ............................... 225/3, 15, 16; 977/DIG. 1; 445/5

(56) References Cited

U.S. PATENT DOCUMENTS

| | | | |
|---|---|---|---|
| 5,958,358 A | | 9/1999 | Tenne et al. |
| 6,231,980 B1 | | 5/2001 | Cohen et al. |
| 6,422,450 B1 | * | 7/2002 | Zhou et al. ............ 219/121.85 |
| 6,452,171 B1 | * | 9/2002 | Moloni ........................ 250/307 |
| 6,582,673 B1 | * | 6/2003 | Chow et al. ............ 423/445 R |
| 2002/0005876 A1 | * | 1/2002 | Grimes et al. ................. 347/53 |
| 2002/0053522 A1 | * | 5/2002 | Cumings et al. ............ 205/640 |
| 2002/0070426 A1 | * | 6/2002 | Cumings et al. ............ 257/613 |
| 2002/0125470 A1 | * | 9/2002 | Hoenlein et al. ............... 257/1 |
| 2002/0141934 A1 | * | 10/2002 | Gogotsi et al. ............. 423/448 |

OTHER PUBLICATIONS

Nakayama et al, "Nanoengineering of Crbon Nanotubes for Nanotools", New Journal of Physics, 5 (Oct. 2003) 128.*
Zettle et al, "Sharpened Nanotubes, Nanobearings, and Nanosprings", Conference Report, Electronic Properties of Novel Materials–Molecular Nanostructures: XIV International Winterschool/Euroconference, Kirchberg, Tirol (Austria) Mar. 4–11, 2000.*
Zettle et al., "Peeling and Sharpening Multiwall Nanotubes", Nature, vol. 406, Aug. 10, 2000, 586.*
Moloni et al, "Sharpened Carbon Nanotube Probes", University of Wisconsin, 2000.*
Charlier et al. (1993), "Energetics of Multilayered Carbon Tubules," *Physical Review Letters* 70(12):1858–1861.
Cumings et al. (2000), "Low–Friction Nanoscale Linear Bearing Realized from Multiwall Carbon Nanotubes," *Science* 289:602–604.
Falvo et al. (1999), "Nanometre–Scale Rolling and Sliding of Carbon Nanotubes," *Nature* 397:236–238.
Kolmogorov et al. (2000), "Smoothest Bearings: Interlayer Sliding in Multiwalled Carbon Nanotubes," *Physical Review Letters* 85(22):4727–4730.

(Continued)

*Primary Examiner*—H. Thi Le
(74) *Attorney, Agent, or Firm*—Dianne E. Reed; Reed Intellectual Property Law Group (57) ABSTRACT

The invention relates to a method for forming a telescoped multiwall nanotube. Such a telescoped multiwall nanotube may find use as a linear or rotational bearing in microelectromechanical systems or may find use as a constant force nanospring. In the method of the invention, a multiwall nanotube is affixed to a solid, conducting substrate at one end. The tip of the free end of the multiwall nanotube is then removed, revealing the intact end of the inner wall. A nanomanipulator is then attached to the intact end, and the intact, core segments of the multiwall nanotube are partially extracted, thereby telescoping out a segment of nanotube.

17 Claims, 4 Drawing Sheets

OTHER PUBLICATIONS

Yu et al. (2000), "Controlled Sliding and Pullout of Nested Shells in Individual Multiwalled Carbon Nanotubes," *J. Phys. Chem. B 104*:8764–8767.

Yu et al. (2000), "Strength and Breaking Mechanism of Multiwalled Carbon Nanotubes Under Tensile Load," *Science 287*:637–640.

Wagner et al. (1998), "Stress–Induced Fragmentation of Multiwall Carbon Nanotubes in a Polymer Matrix," *Appl. Phys. Lett. 72*(2):188–190.

Zettl et al. (2000), "Sharpened Nanotubes, Nanobearings, and Nanosprings," *Electronic Properties of Novel Materials—Molecular Nanostructures*, No. 544, pp. 526–532, 14th International Winterschoool/Euroconference, Kirchbert, Austria.

Benedict et al. (1998), "Microscopic Determination of the Interlayer Binding Energy in Graphite," *Chemical Physics Letters 286*:490–496.

Collins et al. (1997), "Nanotube Nanodevice," *Science 278*:100–103.

Crespi et al. (1999), "Sliding, Stretching, and Tapering: Recent Structural Results for Carbon Nanotubes," *Electronic Properties of Novel Materials—Science and Technology of Molecular Nanostructures*, Kuzmany et al., Eds., American Institute of Physics, College Park, Maryland, pp. 364–368.

Cumings et al. (2000), "Peeling and Sharpening Multiwall Nanotubes," *Nature 406*:586.

Falvo et al. (1997), "Bending and Buckling of Carbon Nanotubes Under Large Strain," *Nature 389*:582–584.

Falvo et al. (1998), "Nanomanipulation Experiments Exploring Frictional and Mechanical Properties of Carbon Nanotubes," *Microspy and Microanalysis 4*:504–512.

Hamada et al. (1992), "New One–Dimensional Conductors: Graphitic Microtubules," *Physical Review Letters 68*(10):1579–1581.

Iijima (1991), "Helical Microtubules of Graphitic Carbon," *Nature 354*:56–58.

Iijima et al. (1992), "Growth Model for Carbon Nanotubes," *Physical Review Letters 69*(21):3100–3103.

Iijima et al. (1996), "Sturctural Flexibility of Carbon Nanotubes," *J. Chem. Phys. 104*(5):2089–2092.

Iijima (1998), "Carbon Nanotubes and Their Recent Developments," *Proc. IEEE Eleventh Annual International Workshop on Micro Elector Mechanical Systems*, IEEE, Heidelberg, Germany, pp. 520–525.

Kolmogorov et al. (2000), "Barriers to Sliding in Double–Wall Carbon Nanotubes," *Bulletin of the American Physical Society, Mar. Meeting 2000 45*(1):254.

Paulson et al. (1999), "In Situ Resistance Measurements of Strained Carbon Nanotubes," *Applied Physics Letters 75*(19):2936–2938.

Persson (1999), "Sliding Friction," *Surface Science Reports 33*:83–119.

Poncharal et al. (1999), "Electrostatic Deflections and Electromechanical Resonances of Carbon Nanotubes," *Science 283*:1513–1516.

Saito et al. (1992), "Electronic Structure of Chiral Graphene Tubules," *App. Phys. Let. 60*(18):2204–2206.

* cited by examiner

TELESCOPED MULTIWALL NANOTUBE AND MANUFACTURE THEREOF

CROSS-REFERENCE TO RELATED APPLICATIONS

This application claims priority under 35 U.S.C. §119(e)(1) to U.S. Provisional Patent Application Ser. No. 60/220,550, filed Jul. 25, 2000.

TECHNICAL FIELD

The present invention relates to a method for forming a low-friction, nanoscale bearings from a multiwall nanotube. The invention finds utility in the field of microelectromechanical systems (MEMS) technology.

BACKGROUND

There is currently substantial interest in reducing the size scale of various mechanical systems, and dramatic recent advances have been achieved in the fabrication of microelectromechanical systems. A review of current trends in microelectromechanical systems can be found in W. Trimmer, (1997) *Micromechanics and MEMS: Classic and Seminal Papers to* 1990, IEEE Press, New York. Ultimately, such systems are expected to reach well into the nanometer domain, and hence considerations of the mechanical behavior of materials at the nano- or atomic-scale, including those related to atomic perfection and friction, become critically important.

Carbon nanotubes, as discussed in Iijima (1991) *Nature* 354:56–58, have unique mechanical and electronic properties that make them outstanding candidates for nanomechanical or nanoelectromechanical applications, such as nanoscale electronics, see Collins et al. (1997) *Science* 278:100–103, and nanoscale mechanical systems, see Iijima (1998) *Proc. IEEE Eleventh annual International Workshop on Micro Elector Mechanical Systems* (IEEE, Heidelberg, Germany), 520–525. For a discussion of the mechanical properties of carbon nanotubes see Iijima et al. (1996) *J. Chem. Phys.* 104:2089–92, Poncharal et al. (1999) *Science* 283:1513–16, and Wagner, et al. (1998) *Appl. Phys. Let.* 72:188–90. For a review of the electronic properties of carbon nanotubes see N. Hamada et al. (1992) *Phys. Res. Lett.* 68:1579–81, and Saito et al. (1992) *App. Phys. Let.* 60:2204–6.

Multiwall carbon nanotubes (MWCNTs) comprise concentric cylindrical layers or shells of graphite-like $sp^2$-bonded carbon, where the intershell interaction is predominantly van der Waals. In analogy to the well-known lubricating properties of van der Waals bonded graphite, the individual cylinders of MWNTs might be expected to easily slide or rotate with respect to one another, forming near-ideal linear and rotational nanobearings. Recent theoretical calculations disclosed by Kolmogorov et al. ((2000) *Bulletin of the APS,* March Meeting 2000, Minneapolis, Minn. (American Institute of Physics)) and Crespi et al.((1999) in *Electronic Properties of Novel Materials—Science and Technology of Molecular Nanostructures,* Kuzmany et al., Eds. (American Institute of Physics, College Park, Md. pp. 364–368) indicate that the MWNT interlayer corrugation energy is indeed small, favoring such motion. For a MWNT, one could envision an extension mode much like the "telescoping" of a mariner's traditional spyglass. Some evidence for inadvertent MWNT telescopic extension can be found in severe mechanical stress failure mode studies, including MWNTs embedded in a stressed polymer composite, see Wagner et al. (1998) *Appl. Phys. Let.* 72:188–90, and for MWNTs torn apart in quasi-static tensile stress measurements performed in a scanning electron microscope, see Yu et al. (2000) *Science* 287:637–640. However, no demonstration of controlled and reversible telescoping of MWNTs has been previously achieved.

A major difficulty in initiating controlled telescoping in MWNTs is the commonly capped ends that seal in all inner core nanotube cylinders. Even if the MWNT ends are opened by methods such as acid etching, it is difficult to selectively contact only the core tubes. Recently, a method has been disclosed whereby the ends of a MWNT can be carefully opened, removing the caps from just the outer shell nanotubes while leaving the core nanotubes fully intact and protruding, see Cumings et al. (2000) *Nature* 406:586. It has been found that the method of Cumings et al. can be used to attach a moveable nanomanipulator to the core nanotubes within a MWNT. This attachment allows for in-situ manipulation of the nanotube core thereby providing controlled reversible telescoping. Robust ultra-low friction linear nanobearings and (constant-force) nanosprings are demonstrated.

SUMMARY OF THE INVENTION

Accordingly, it is an object of the present invention to overcome the above-mentioned disadvantages of the prior art by providing a method for forming a telescoped multiwall nanotube and a device comprising a telescoped multiwall nanotube that may find utility as a low-friction bearing or constant force spring.

Additional objects, advantages and novel features of the invention will be set forth in part in the description that follows, and in part will become apparent to those skilled in the art upon examination of the following, or may be learned through routine experimentation upon practice of the invention.

In one embodiment, the invention relates to a method for forming a telescoped nanotube. First, a multiwall nanotube is provided. The nanotube is comprised of an outer shell, a plurality of concentric inner shells, and an inner core. Each of the plurality of concentric inner shells, the outer shell, and the inner core has a first end and an opposing second end, and the first end of the outer shell is attached to a conducting substrate so as to be in electrical communication therewith. Next, the second ends of the outer shell and the concentric inner shells are removed, revealing the second end of the inner core. A nanomanipulator is then attached to the exposed second end of the inner core and the inner core is partially extracted from the outermost shell, thereby telescoping one segment of the multiwall nanotube to provide the telescoped multiwall nanotube. The nanomanipulator is then optionally detached from the inner core.

Optionally, the inner core is comprised of secondary concentric inner shells and a secondary inner core, each having first and second ends, the end removal, nanomanipulator attaching, and core extracting steps are repeated so that multiple segments of nanotube are sequentially telescoped. Generally, at least three segments of nanotube are telescoped. The opposing end of the outer shell is removed using a shaping electrode and is carried out while the nanotube and the shaping electrode are under a potential difference.

In another embodiment, the invention pertains to a device comprising a telescoped multiwall nanotube. The device is comprised of an outer shell having a cylindrical wall, a closed end, and an interior cavity defined by the cylindrical wall and the closed first end. A telescoped segment is partially housed within the interior cavity of the outer shell and partially extends from the outer shell, the segment having a cylindrical segment wall, a closed segment end, and a segment cavity. The telescoped segment may comprise a plurality of concentric telescoped segments. Each concentric segment is partially housed within the segment cavity of the concentric segment surrounding it and each segment partially extends from the segment cavity of the segment in which it is housed. Such concentric telescoped segments are generally movable and may provide a static spring force. Such concentric telescoped segments may also provide substantially frictionless rotation, extension, and retraction.

The telescoped multiwall nanotube is comprised of a material selected from the group consisting of: GaSe; $NiCl_2$; $TiO_2$; $Sb_2S_3$; $K_4Nb_6O_{17}$; $PbNb_mS_{(2m+1)}$, where m is an integer from 1 to 10; $B_xC_yN_z$, where x is about 0 to about 1, y is about 0 to about 3, and z is about 0 to about 4; $MX_n$ where M is selected from the group consisting of Nb, V, Zr, Hf, Re, Pt, Ta, W, and Mo, X is selected from the group consisting of S, Se, and Te, and n is 2 or 3; and $W_aMo_bC_cS_2$ wherein a is about 0 to about 3, b is about 0 to about 3, and c is about 0 to about 4. Preferably the material is carbon. The concentric telescoped segments may be comprised of a plurality of concentric inner shells range from about 3 to about 1000. Ranges of from about 3 to about 100 are more customary and ranges from about 3 to about 50 are preferred.

Such a telescoped multiwall nanotube may find use as linear or rotational bearing in a MEMS or may find use as a constant force nanospring.

DETAILED DESCRIPTION OF THE INVENTION

Before the invention is described in detail, it is to be understood that unless otherwise indicated this invention is not limited to particular materials, components or manufacturing processes, as such may vary. It is also to be understood that the terminology used herein is for purposes of describing particular embodiments only, and is not intended to be limiting.

It must be noted that, as used in the specification and the appended claims, the singular forms "a," "an" and "the" include plural referents unless the context clearly dictates otherwise. Thus, for example, reference to "a nanotube" includes a single nanotube as well as two or more nanotubes, "a shaping electrode" includes a single shaping electrode as well as an assembly of two or more shaping electrodes, "a layer" may be a single layer or may comprise two or more layers and the like.

In this specification and in the claims that follow, reference will be made to a number of terms that shall be defined to have the following meanings unless the context clearly indicates otherwise:

The term "nanotube" as used herein refers to a solid, cylindrically shaped and discrete fibril typically characterized by a substantially constant diameter of typically about 1 nm to about 100 nm, preferably about 2 nm to about 50 nm. In addition, the nanotube typically exhibits a length greater than about 10 times the diameter, preferably greater than about 100 times the diameter. The term "multiwall" as used to describe nanotubes refers to nanotubes having a layered structure, such as a fullerene-like structure, so that the nanotube comprises an outer region of multiple continuous layers of ordered atoms and an optional distinct inner core region or lumen. The layers are disposed substantially concentrically about the cylindrical axis of the fibril.

The term "transition metal chalcogenide" is used herein in its ordinary sense and refers to a compound having at least one metallic element having an incomplete inner electron shell, marked by multiple valences and at least one element from Group 16 of the period table. As used herein all reference to the elements and groups of the Periodic Table of the Elements is to the version of the table published by the Handbook of Chemistry and Physics, CRC Press, 2000, which sets forth the new IUPAC system for numbering groups. Thus, the term "transition metal chalcogenides" include mixed metal chalcogenides, metal mixed chalcogenides and mixed metal mixed chalcogenides. Preferred transition metals include titanium, zirconium, hafnium, vanadium, niobium, tantalum, chromium, molybdenum, tungsten, iron, ruthenium, osmium, cobalt, nickel, copper and silver. Preferred chalcogens include sulfur, selenium and tellurium.

The term "potential" is used herein in its ordinary sense and describes an electrostatic phenomenon as a scalar quantity. Thus, the term "potential difference" is used in its ordinary sense to refer to the change in potential energy by a test charge. Similarly, the term "ground" refers to the potential of an effectively infinite sink to which electrons can easily migrate.

Thus, one embodiment of the invention relates to a method for forming a telescoped nanotube. First, a multiwall nanotube is provided. Multiwall nanotubes are well known, as are methods of constructing them. The most common and easily constructed nanotubes are made from carbon using carbon arc discharge methods. Techniques for producing carbon nanotubes are well known in the art. Carbon nanotubes are widely commercially available and may be obtained, for example, from Hyperion Catalysis International, Inc. (Cambridge, Mass.) or from Carbon Nanotechnologies Incorporated (Houston, Tex.). See Iijima (1991) Nature 354:56–58. Other methods and materials are also known in the art. For example, U.S. Pat. No. 6,231,980 to Cohen et al., discusses nanoscale particles and tubes made from a variety of stoichiometries of $B_xC_yN_z$ where x, y, and z indicate a relative amount of each element compared to the others and U.S. Pat. No. 5,958,358 to Tenne et al. discloses a method of preparing polycrystalline nested nanotubes of transition metal chalcogenides.

The exact method and construct of the multiwall nanotube is not critical and a suitable multiwall nanotube can be comprised of any material so long as the material is layered in nature, i.e., having a structure wherein certain atoms of the structure are held together by strongly directed covalent or ionic bonds in a hexagonal or other array to form layers, while bonds transverse to the layers are formed as a result of weak forces such as van der Waal forces. Examples of suitable materials include, but are not limited to, carbon (e.g., graphite), boron nitride, boron carbon nitride and transition metal dichalcogenides. Materials having a crystalline structure selected from the group consisting of GaSe, $NiCl_2$, $TiO_2$, $Sb_2S_3$, $K_4Nb_6O_{17}$, and $PbNb_mS_{(2m+1)}$, where m is an integer from 1 to 10, are all suitable. Also suitable are materials having the crystalline structure $B_xC_yN_z$, where x is about 0 to about 1, y is about 0 to about 3, and z is about 0 to about 4. Suitable chalcogenides and dichalogenides include, but are not limited to, compounds having the formula $MX_n$ where M is selected from the group consisting of Nb, V, Zr, Hf, Re, Pt, Ta, W, and Mo, X is selected from the group consisting of S, Se, and Te, and is n is 2 or 3. Other suitable materials are those having the structure $W_aMo_bC_cS_2$ wherein a is about 0 to about 3, b is about 0 to about 3, and c is about 0 to about 4. Optionally, these materials may be doped with trace amounts of any of a number of elements to improve certain properties of the materials for a particular purpose, e.g., to decrease the electronic band gap to enhance electrical conductivity. Regardless of the material selected, the multiwall nanotube is comprised of an outermost shell, a plurality of concentric inner shells, and an inner core, each having first and second opposing ends.

Once a suitable nanotube is provided, a first end of the nanotube is attached to a suitable conducting substrate. Both the substrate and materials employed to attach the nanotube to the substrate should be made from a material that does not represent a source of contamination during the shaping process. Thus, the substrate may be formed from an inert material such as gold, platinum or other noble metal and the attachment may be made via a solid carbonaceous material deposited on to the surface of the conducting substrate. Such methods are described in Yu et al. (2000) *Science* 287:637–640. As discussed in Yu et al., the carbonaceous material is deposited by focusing an electron beam at the desired location on the substrate. The electron beam disassociates residual organic species on the substrate surface, which are then deposited onto the substrate surface. The rate at which the carbonaceous material is deposited on the substrate is dependent upon the imaging parameters, the vacuum quality, and surface contamination on the substrate. Additionally, organic contamination on the substrate surface may also migrate toward the focal point of the electron beam and be dissociated and deposited.

Other suitable methods of attaching the nanotube to the substrate include employing adhesives known in the art such as acrylates, methacrylates or epoxies (in liquid, tape of other forms); employing electrostatic forces; spot welding; mechanical clamping or fixing; exploiting the chemical affinity between the substrate and the nanotube; or synthesizing the nanotube on the substrate. In addition, such methods may be employed in combination. For example, during nanotube synthesis, a number of other phases may also be synthesized from an aggregate that encapsulates the nanotube. Such an aggregate may be immobilized with respect to a substrate using a conductive adhesive. Then, mechanical energy may be applied to the aggregate to fracture the aggregate. As a result, the nanotube is exposed.

After attachment of the nanotube to the conducting substrate, the second ends of the outer shell and inner concentric shells are removed thereby exposing the second end of the inner core. The removal of these ends is accomplished by the use of a shaping electrode. The material removal is carried out while the nanotube and the shaping electrode are under a potential difference. Typically, the potential difference is no more than about 10 volts. However, the potential difference is preferably is no more than about 5 volts and optimally about 0.5 to about 3.0 volts. In addition, it is preferred that the potential of the nanotube is at or near ground. The use of such a shaping electrode is disclosed in copending and commonly assigned U.S. application Ser. No. 09/915,207, entitled "A METHOD FOR SHAPING A NANOTUBE AND A NANOTUBE SHAPED THEREBY," filed Jul. 24, 2001. While any of a number of shaping electrodes may be employed, the preferred shaping electrode comprises an additional nanotube located at the end of a nanomanipulator. The nanotube may be of the same material as the multiwall nanotube to be telescoped, or may comprise a different material. If that nanotube is used as the shaping electrode, the nanotube so used will typically be larger than the nanotube to be shaped.

Depending on the potential difference, removal of the ends may take place when the shaping electrode contacts the second end of the outer shell or when the shaping electrode is sufficiently close to the second end of the outer shell. Thus, removal of the second ends of the outer shell and the inner concentric shells may not require contact between the shaping electrode and the nanotube.

In some instances, material removal at the second ends of the outer shell and inner concentric shells can be carried out by first placing the shaping electrode in contact with the nanotube when the shaping electrode and the nanotube do not exhibit a sufficient potential difference for material removal from the nanotube and then controllably increasing the potential difference between the electrode and the nanotube to remove the second ends of the outer shell and the inner concentric shells. In other instances, the shaping electrode may be placed in a non-contacting yet proximal relationship with the nanotube whereby the shaping electrode and the nanotube do not exhibit a sufficient potential difference for material removal. Once in place, the potential difference between the electrode and the nanotube is then controllably increased, thereby removing the second ends of the outer shell and inner concentric shells and exposing the second end of the inner core. Preferably, material removal is carried out under vacuum, since gases that are ordinarily considered inert may react with the nanotube.

As another option, a constant potential difference may be generated between the nanotube and the shaping electrode when they are not in proximal relationship with each other. Then, under the constant potential difference, the nanotube and the shaping electrode are brought into a proximal or contacting relationship effective to remove the material from the end of the multiwall nanotube. Thus, modification of both the relative distance and potential difference between the multiwall nanotube and the shaping electrode may be used to control the removal of material from the multiwall nanotube.

While any of a number of shaping electrodes may be employed, the preferred shaping electrode comprises an additional nanotube. The additional nanotube may comprise the same material as the multiwall nanotube or may be different. Typically, the additional nanotube is larger than the multiwall nanotube to be telescoped.

A nanomanipulator is attached to the exposed second end of the inner core via spot welding or other suitable method and the inner core partially extracted from the outermost shell, thereby telescoping one segment of nanotube. Once the segment is telescoped, the nanomanipulator is removed. The nanomanipulator is generally an atomic force microscope probe, although other suitable nanomanipulators may be used, and are commercially available. Any of a number of nanomanipulators (also termed "nanopositioners") such as those used in electron microscopy may be employed or adapted for the present invention. Nanomanipulators are commercially available and may be obtained, for example, from Piezomax Technologies, Inc (Middleton, Wis.) or 3rdTEch, Inc. (Chapel Hill, N.C.). Further information regarding the manipulation of nanotubes can be found in Falvo et al. (1999), "Rolling and sliding of carbon nanotubes," Nature 397:236–238, Falvo et al. (1998), "Nanomanipulation experiments exploring frictional and mechanical properties of carbon nanotubes," Microscopy and Microanalysis 4: 504–512, Falvo et al. (1997), "Bending and buckling of carbon nanotubes under large strain," Nature 389:582–584, Paulson et al. (1999), "In situ resistance measurements of strained carbon nanotubes," App. Phys. Lett. 75(19): 2936–2938.

It will be obvious to one of skill in the art that the nanomanipulator and the shaping electrode may comprise the same device and the removal of the second end of the outer shell and the attachment of the nanomanipulator may occur simultaneously. For example, if the shaping electrode directly contacts the multiwall nanotube and removal of the second end of the outer shell is effected by the increase of the potential difference between the shaping electrode and the multiwall nanotube, the attachment of the shaping electrode to the intact second ends of the inner shells may occur as the potential difference between the shaping electrode and the multiwall nanotube decreases.

If desired, the second end of the inner core of the multiwall nanotube may be removed using the above-described method, thereby exposing the second ends of any of secondary concentric inner shells. The newly exposed second ends may then also be contacted with a nanomanipulator and telescoped.

FIG. 1 schematically illustrates the steps involved in the inventive method and possible manipulations of the telescoped nanotubes. An as-grown MWNT produced by conventional arc-plasma methods is first rigidly mounted as shown in FIG. 1(a), and the free end of the MWNT is then removed to expose the core tubes, as shown in FIG. 1(b). In FIG. 1(c), the nanomanipulator is brought into contact with the core tubes and, using electrical current, is spot welded to the core.

Figure 1A:
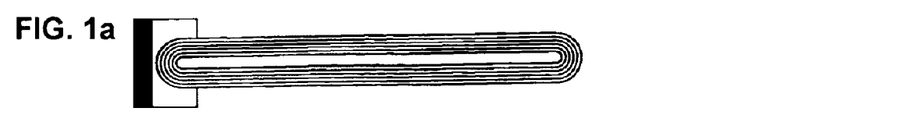
FIGS. 1(a) 1(f), collectively referred to as FIG. 1 schematically illustrate the method of the inventions and several manipulations made of the telescoped multiwall nanotube so produced.
Figure 1B:
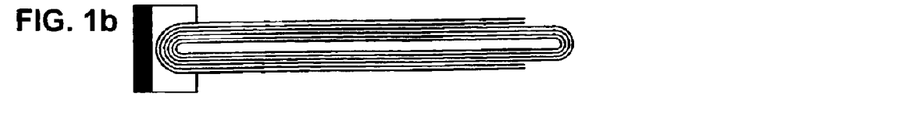
Figure 1C:
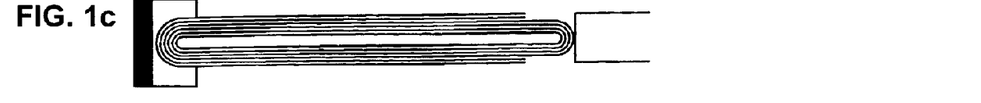
Figure 1D:
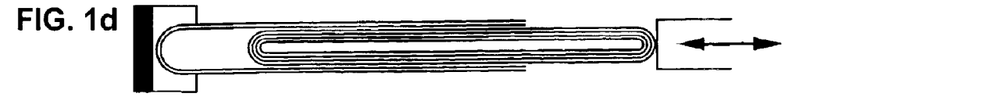
Figure 1E:
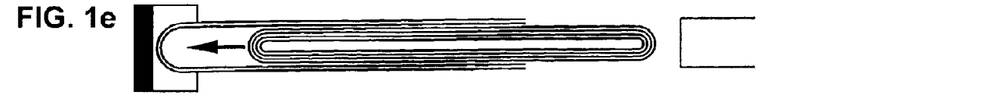
Figure 1F:
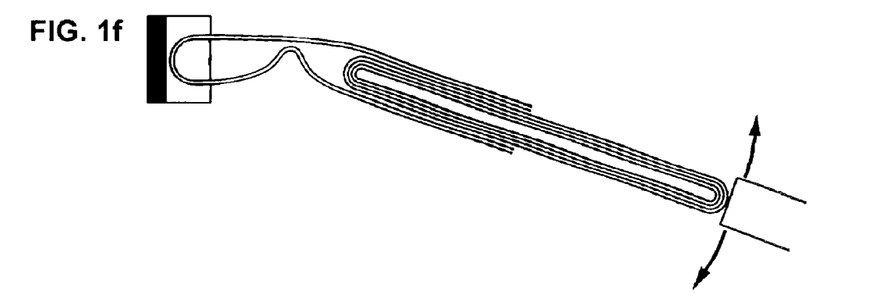

FIGS. 1(d), 1(e), and 1(f) show three different manipulations of the telescoped nanotubes. In FIG. 1(d) the manipulator is moved right and left, thus telescoping the core out of, or reinserting it into, the housing of outer shell. The extraction/reinsertion process has been repeated numerous times, all the while viewing the MWNT at high TEM resolution to test for atomic-scale nanotube surface wear and fatigue. In FIG. 1(e), the manipulator first telescopes out the inner core and then fully disengages, allowing the core to be drawn back into the outer shells primarily by the inter-tube van der Waals energy-lowering force. In FIG. 1(f), a telescoped nanotube is subjected to additional transverse displacements, and reversible mechanical failure modes such as buckling and complete collapse are induced.

Figure 2:
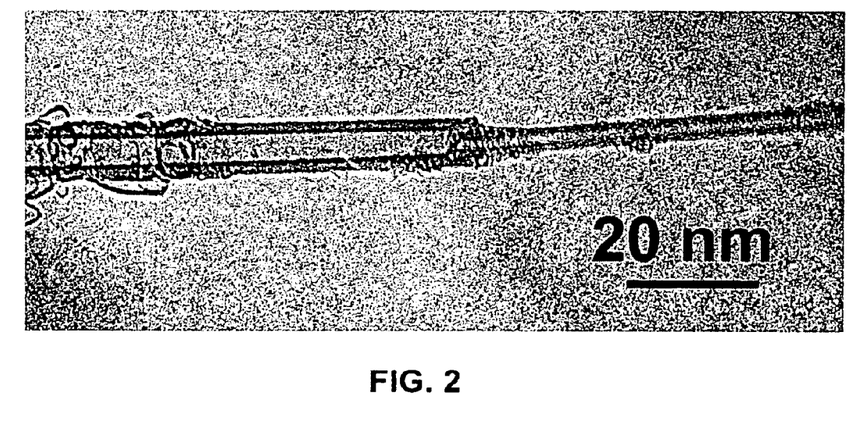
FIG. 2 shows a high-resolution transmission electron microscope (TEM) image of a multiwall nanotube in a fully telescoped position.

FIG. 2 shows a TEM image of a MWNT in a fully telescoped position. Using higher resolution imaging than that used for FIG. 2, it has been determined that this MWNT originally had 9 walls, with an outer diameter of 8 nm and an inner diameter of 1.3 nm. After extension, a 4 nm diameter core segment (consisting of 4 concentric walls) has been almost completely extracted from the outer shell structure. The telescoping process was found to be fully reversible, in that the core could be completely pushed back into the outer shells, restoring the MWNT to its original "retracted" condition. The process of extending and retracting the core was repeated many times for several different MWNTs, and in all cases no apparent damage to the "sliding" surfaces, i.e., the outer tube of the core or the inner tube of the shell structure, was observed, even under the highest TEM resolution conditions (~2 Å). The apparent lack of induced defects or other structural changes in the nanotube contact surfaces at the atomic level suggests strongly that these near atomically perfect nanotube structures may be wear-free and will not fatigue even after a very large number of cycles.

In the engineering of macroscopic bearings, the moving parts are typically cycled $10^3$ to $10^9$ times before definitive conclusions about wear can be drawn. This is because the damage from a single cycle is microscopic and cannot be readily observed by eye or even conventional microscopy. Here, the bearings are observed at the atomic scale, and after all cycles, from the first cycle onward, the atomic structure of the nanotubes is unaffected by motion. Thus, the nanotube sections of the invention are near-perfect sliding surfaces and are apparently free from wear for all cycles.

It has also been observed that repeated sliding motion for a given MWNT takes place between the same nanotube shells. While not wishing to be bound by theory, applicants believe that this repeatability is the result of a self-selection process wherein the most perfect surfaces offer the least resistance to motion. Further evidence for this belief is found in the fact that after repeated motions, the same surfaces remained the "most favored." This fact also provides evidence of the lack of sliding-induced wear on the active surfaces. Of course, in a many-walled MWNT, even the catastrophic failure, i.e., fusing, of one surface pair would not render the MWNT bearing unusable, as another (nearly equally perfect) surface pair would simply become the active elements.

Several internal forces are associated with telescoping MWNTs. To first order, these are the van der Waals-derived force and possible static and dynamic frictional forces. The van der Waals force is given by $$F_{vdW} = \frac{d}{dx}U(x) \tag{1}$$

where the van der Waals energy, see Benedict et al. (1998) Chem. Phys. Let. 286:490–6, is given by $U(x)=-0.16$ Cx joules with C as the circumference of the "active" nanotube bearing cylinders and x as the length of the overlap between the core section and the outer walls, both measured in meters. The van der Waals energy lowering gained by increasing the tube-tube contact area tends to retract the extended core of a telescoped MWNT. Since the active intertube contact area decreases linearly with core tube extension, this restoring force is independent of contact area, or equivalently, independent of core extension. Hence, a telescoped nanotube with only one active (sliding) surface pair is expected to act as a constant force spring.

Figure 3:
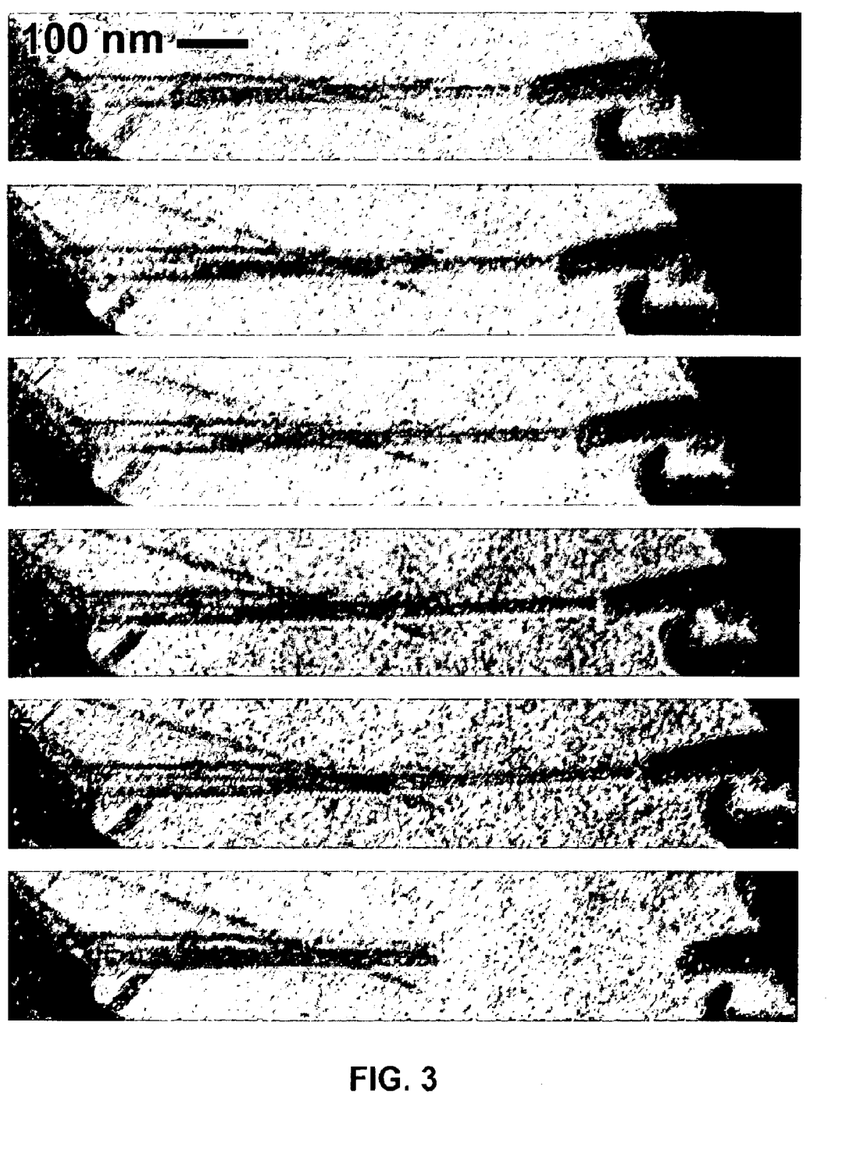
FIG. 3 shows several selected frames from a video recording of the accelerated motion of a core segment after release from the nanomanipulator.

To determine experimentally if $F_{vdW}$ dominates nanotube linear bearing dynamics, the configuration described in FIG. 1(e) was used. The core tubes of a MWNT were first telescoped using the manipulator. Lateral deflections of the manipulator were used to fatigue and eventually break the spot weld, thus releasing the core segment. FIG. 3 shows several selected frames from a video recording of the accelerated motion of a released core segment. The upper five frames show the core segment being slowly and successively telescoped to the right (the structure in the left third of the image seen crossing the MWNT at about a 30° angle is another nanotube unrelated to the experiment and it is not in physical contact with the subject MWNT). Just after the fifth frame the manipulator has released the core segment. The sixth and final frame, which occurred one video frame after the release of the nanotube, shows the core after it rapidly and fully retracted inside the outer shells of the MWNT. The dimensions for the core segment of the MWNT of FIG. 3 yield a core segment mass $2.9 \times 10^{-16}$ g. Combining this with C=57 nm and the initial extension of 330 nm, Eq. (1) leads to complete retraction of the core tubes in 4.6 ns. This is consistent with our experimental observation that the complete contraction occurred in less than one video frame (33 msec).

While macroscopic models of friction between solids dictate that friction is proportional to normal force, independent of contact area, modern microscopic models of friction predict that friction is in fact proportional to contact area, see Persson (1999) *Surf. Sci. Rep.* 33:83–119. In macroscopically rough samples, the actual contact occurs at point asperities, and the microscopic contact area is proportional to the total normal force. Nanotube shells, however, are atomically smooth, so any interlocking between the shells (due, for example, to the atomic corrugations) is best estimated by using the entire surface area of contact. The $F_{vdW}$ retraction force for the nanotube in FIG. 3 is calculated to be a mere 9 nN. This indicates that the static friction force is small, with $f_S < 2.3 \times 10^{-14}$ Newtons per atom ($6.6 \times 10^{-15}$ Newtons per Å$^2$). The full contraction of the tube provides that the dynamic friction $f_k < 1.5 \times 10^{-14}$ Newtons per atom ($4.3 \times 10^{-15}$ Newtons per Å$^2$). Friction is an important concern in small-scale systems such as MEMS. Recent atomic-scale frictional force measurements using conventional materials yield values approximately three orders of magnitude greater than the upper limit on frictional forces found here for MWNT surfaces.

Figure 4A:
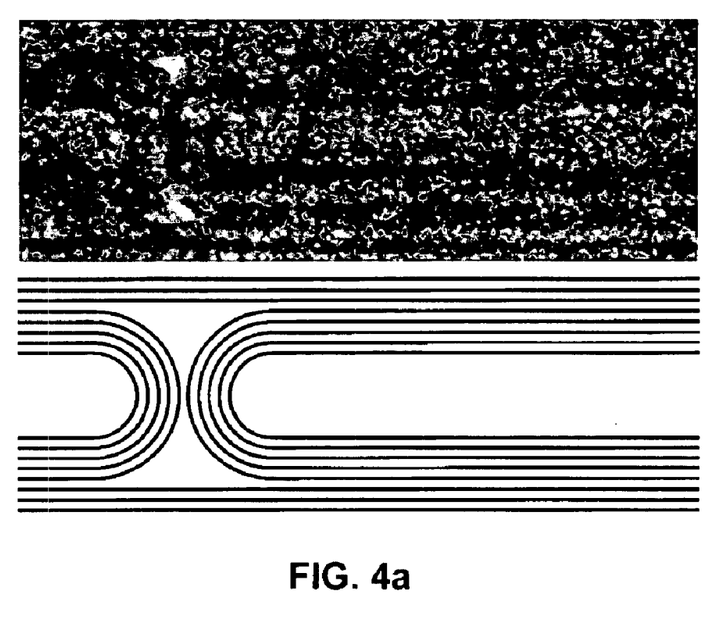
FIG. 4(a) shows a close-up TEM image of a bamboo joint inside a larger multiwall nanotube.
Figure 4B:
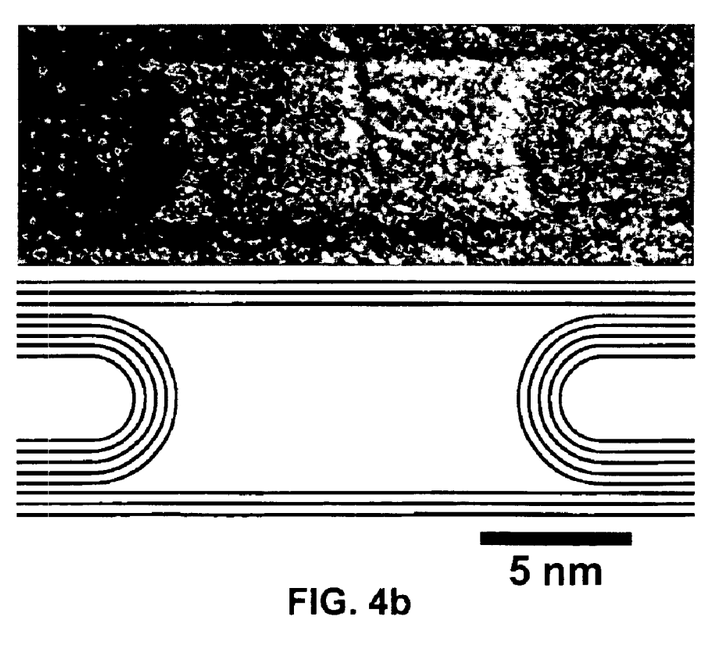
In FIG. 4(b), the core segment on the right has been telescoped out, cleanly separating the bamboo joint.

Minimization of bearing friction may be obtained by using the shortest possible nanotube core/housing overlap. This may be achieved by minimizing the length of the MWNT, maximizing the extraction length, and or by using a "bamboo" configuration such as that disclosed in Iijima et al. (1992) *Phys. Res. Let.* 69:3100–3. In such bamboo configurations, the inner nanotube sections do not extend along the entire length of the MWNT, but rather represent an end-to-end series of shorter, fully capped, nanotube segments residing inside the continuous housing of outer nanotube shells. FIG. 4(a) shows a close-up TEM image of such a bamboo joint inside a larger MWNT. In FIG. 4(b), the core segment on the right has been telescoped out, cleanly separating the bamboo joint. Use of bamboo type MWNT has practical implications for common-axis bearings as short independent bamboo sections might serve as ultra low friction linear or rotational bearings that are firmly embedded in a common long, stiff cylindrical housing.

FIG. 1(f) illustrates lateral deformations of partially telescoped nanotubes. Upon lateral deformation, telescoped MWNTs form kinks and may even fully collapse. MWNTs with large inner diameters and few concentric shells are particularly susceptible to kinking and collapse. MWNT kink and collapse much more readily after the inner core has been removed. For example, a 40 layer core was telescoped out from a nanotube having 60 original layers with an outer diameter of 43 nm to a maximum extension of 150 nm leaving an outer shell housing of just 20 layers with an inner diameter of 29 nm. The housing was supported at the base and the inner core section of the tube was still engaged in the housing for a length of 200 nm. When the manipulator was driven laterally to approximately ~5° angular displacement, the housing shells developed a kink in the middle of the large inner diameter section. At ~26° displacement the kink was severe and resembled the schematic in FIG. 1(f). At any displacement angle, the telescoped core section was still mobile, and could be moved back and forth inside the unkinked portion of the outer shell housing. At small kink angles less than ~10°, the core could be inserted past the kink position, forcing the kink to disappear thereby reinflating the outer shells to their original circular cross section. At more severe bending angles, in excess of ~20°, the kink blocked the inner core section from being fully inserted. Hence, suitable kinking of the outer shell housing provides an effective motion stop for nanotube core insertion.

The above results demonstrate that MWNTs hold great promise for nanomechanical or nanoelectromechanical systems applications. Low-friction low-wear nanobearings and nanosprings are essential ingredients in general NEMS technologies. The transit time for complete nanotube core retraction is on the order of 1–10 nsec, which implies the possibility of exceptionally fast electromechanical switches. In the telescoped geometry, a carbon nanotube could also be used as a variable resistor. It is possible to pass electrical current through the inner shells of the telescoped nanotube to the outer shell during the telescoping, and as such the nanotube forms an electrical resistor. As the nanotube is telescoped further out, the total length of the nanotube is increased, and the amount of overlap between the core and the housing is decreased. If the conduction of the nanotube is governed by Ohm's law (as may be the cases for large or highly defective nanotubes), then the resistance of the nanotube should increase linearly with the extension of the telescoping. If the nanotube is smaller, or of a higher degree of perfection, the conductivity may be governed by the rules of quantum ballistic transport (mesoscopic physics). In such a case, the dependence of the resistance on length may be linear, constant (independent of length), or non-linear. The non-linear dependence may be periodic (oscillating on the scale of atomic distances as individual atoms slide out of the overlap region), exponential (governed by the rules of localization), or some other dependence not yet theoretically predicted. The case of linear dependence would be the easiest to apply, as it is a simple resistance potentiometer, but the other cases may find even more utility in future nanoscale applications.

It is to be understood that while the invention has been described in conjunction with the preferred specific embodiments thereof, that the foregoing description and examples are intended to illustrate and not limit the scope of the invention. Other aspects, advantages and modifications within the scope of the invention will be apparent to those skilled in the art to which the invention pertains.

All patents, patent applications, and publications mentioned herein are hereby incorporated by reference in their entireties.

We claim:

1. A method for forming a telescoped nanotube, comprising:

(a) providing a multiwall nanotube comprised of an outer shell, a plurality of concentric inner shells, and an inner core, each of said outer shell, inner shells, and inner core having a first end and a second end in opposition thereto;

(b) attaching the first end of the outer shell to a conductive substrate so as to be in electrical communication therewith;

(c) removing the second end of the outer shell and of the concentric inner shells, revealing the second end of the inner core;

(d) attaching a nanomanipulator to the second end of the inner core, said nanomanipulator effective to partially extract the inner core from the outer shell; and (e) partially extracting the inner core from the outer shell and the concentric inner shells, thereby telescoping one segment of the multiwall nanotube.

2. The method of claim 1, further comprising:

(f) detaching the nanomanipulator from the inner core.

3. The method of claim 2, wherein the inner core is comprised of secondary concentric inner shells and a secondary inner core, each having first and second opposing ends, and steps (c) to (f) are repeated on the inner core so that multiple segments of nanotube are sequentially telescoped.

4. The method of claim 1, wherein the concentric inners shells comprise a series of shorter, fully capped, nanotube segments.

5. The method of claim 1, wherein the multiwall nanotube comprises a material selected from the group consisting of GaSe; $NiCl_2$; $TiO_2$; $Sb_2S_3$; $K_4Nb_6O_{17}$; $PbNb_mS_{(2m+1)}$, wherein m is an integer from 1 to 10; $B_xC_yN_z$, wherein x is about 0 to about 1, y is about 0 to about 3, and z is about 0 to about 4; $MX_n$ wherein M is selected from the group consisting of Nb, V, Zr, Hf, Re, Pt, Ta, W, and Mo, X is selected from the group consisting of S, Se, and Te, and n is 2 or 3; and $W_aMo_bC_cS_2$ wherein a is about 0 to about 1, b is about 0 to about 3, and c is about 0 to about 4.

6. The method of claim 5, wherein the material is carbon.

7. The method of claim 1, wherein the number of inner shells ranges from about 3 to about 1000.

8. The method of claim 7, wherein the number of inner shells ranges from about 3 to about 100.

9. The method of claim 8, wherein the number of inner shells ranges from about 3 to about 50.

10. The method of claim 1, wherein step (c) is conducted using a shaping electrode to remove material from the second end of the outer shell while the nanotube and the shaping electrode are under a potential difference.

11. The method of claim 10, wherein the potential difference is no more than about 10 volts.

12. The method of claim 11, wherein the potential difference is no more than about 5 volts.

13. The method of claim 12, wherein the potential difference is about 0.5 to about 3.0 volts.

14. The method of claim 10, wherein the potential of the nanotube is at or near ground.

15. The method of claim 10, wherein the shaping electrode contacts the nanotube during step (c).

16. The method of claim 10, wherein the shaping electrode does not contact the nanotube during step (c).

17. The method of claim 1, wherein steps (c) and (d) occur in simultaneously.

* * * * *

UNITED STATES PATENT AND TRADEMARK OFFICE
CERTIFICATE OF CORRECTION

PATENT NO.       : 6,874,668 B2
APPLICATION NO.  : 09/915196
DATED            : April 5, 2005
INVENTOR(S)      : John P. Cumings et al.

Page 1 of 1

It is certified that error appears in the above-identified patent and that said Letters Patent is hereby corrected as shown below:

On Column 1, line 9, after "Cross-Reference To Related Applications", please insert the following:

--STATEMENT OF GOVERNMENTAL SUPPORT
This invention was made with government support under Contract DE-AC02-05CH11231 awarded by the United States Department of Energy to The Regents of the University of California for the management and operation of the Lawrence Berkeley National Laboratory. The government has certain rights in this invention.--

Signed and Sealed this

Nineteenth Day of February, 2008

JON W. DUDAS
*Director of the United States Patent and Trademark Office*